United States Patent [19]

Matsuda

[11] Patent Number: 4,587,550
[45] Date of Patent: May 6, 1986

[54] PRESS-PACKED SEMICONDUCTOR DEVICE WITH LATERAL FIXING MEMBER

[75] Inventor: Hideo Matsuda, Yokohama, Japan

[73] Assignee: Tokyo Shibaura Denki Kabushiki Kaisha, Kawasai, Japan

[21] Appl. No.: 637,336

[22] Filed: Aug. 3, 1984

Related U.S. Application Data

[63] Continuation of Ser. No. 331,023, Dec. 15, 1981.

[30] Foreign Application Priority Data

Dec. 16, 1980 [JP] Japan .................... 55-176477

[51] Int. Cl.[4] ............. H01L 23/36; H01L 23/10
[52] U.S. Cl. ........................ 357/79; 357/76; 357/77; 357/80; 357/81
[58] Field of Search ............ 357/76, 77, 79, 80, 357/81

[56] References Cited

U.S. PATENT DOCUMENTS

| | | | |
|---|---|---|---|
| 2,712,619 | 7/1955 | Zetwo | 357/79 |
| 3,328,650 | 1/1967 | Boyer | 357/79 |
| 3,489,957 | 1/1970 | De Warga | 357/79 |
| 3,654,529 | 4/1972 | Lord | 357/79 |
| 3,800,192 | 3/1974 | Eisele et al. | 357/79 |
| 4,129,243 | 12/1978 | Cusano et al. | 357/79 |
| 4,246,596 | 1/1981 | Iwasaki | 357/79 |
| 4,374,393 | 2/1983 | Kamahara | 357/80 |

FOREIGN PATENT DOCUMENTS

| | | | |
|---|---|---|---|
| 2756005 | 6/1979 | Fed. Rep. of Germany | 357/79 |
| 45-29257 | 9/1970 | Japan | 357/79 |
| 54-45573 | 4/1979 | Japan | 357/79 |
| 55-19801 | 2/1980 | Japan . | |
| 1353602 | 4/1970 | United Kingdom | 357/79 |

Primary Examiner—Martin H. Edlow
Assistant Examiner—Jerome Jackson
Attorney, Agent, or Firm—Finnegan, Henderson, Farabow, Garrett & Dunner

[57] ABSTRACT

A press-packed semiconductor device in which means for positioning and fixing a semiconductor element with respect to an electrode disk member is improved. In a press-packed semiconductor device, a semiconductor element is press-held between a pair of electrode disk members via heat buffer plates. According to this invention, a fixing member made of electrical insulating material is provided on the peripheral portions of at least one of main surfaces of a semiconductor substrate of the semiconductor element. The inner periphery of the fixing member is formed so as to substantially contact the outer periphery of at least one of the heat buffer plate. This contact provides a reliable and easy positioning and lateral fixing of the semiconductor element against the heat buffer plate. Accordingly, to braze the electrode to the heat buffer plate of the semiconductor device becomes unnecessary.

8 Claims, 5 Drawing Figures

PRESS-PACKED SEMICONDUCTOR DEVICE WITH LATERAL FIXING MEMBER

This application is a continuation of application Ser. No. 331,023, filed Dec. 15, 1981.

BACKGROUND OF THE INVENTION

I. Field of the Invention

The present invention relates to a semiconductor device and more particularly a press-packed semi-conductor device with improved positioning and returning means of a semiconductor element with respect to electrode disk members.

II. Description of the Prior Art

A press-packed semiconductor device includes, for example, a power diode whose longitudinal sectional view is shown in FIG. 1. The semiconductor device is provided with an insulating tubular body 1 made of ceramic, a pair of ring-shaped covers 2 and 2' made of for example Kovar (manufactured by Westinghouse Electric Corp.) and hermetically oppositely mounted at both end faces of the tubular body 1, and a pair of electrode disk members 3a and 3c partially and hermetically fitted in both end openings of the ring-shaped covers 2 and 2' coaxially with the insulating tubular body 1. The insulating tubular body 1, the ring-shaped covers 2 and 2', and the electrode disk members 3a and 3c cooperatively make up an hermetic enclosure. A semi-conductor element 4, disposed between the pair of electrode disk members, is press-supported by heat buffer plates 5a and 5c respectively disposed between the semiconductor element 4 and the corresponding electrode disk member 3a or 3c.

As for the semiconductor element 4, a cathode electrode 4c made of Al or Au is provided on one of the main surfaces of the silicon substrate 4b (e.g. the upper surface as viewed in FIG. 1). The other main surface (the lower surface as viewed in FIG. 1) of the silicon substrate 4b is brazed to one of the main surfaces of the heat buffer plate 5a made of Mo or W by means of a brazing layer 4a serving also as an anode electrode. The heat buffer plate 5a is coaxially supported to the inner wall of the insulating tubular body 1 at the peripheral surface of the same by means of a positioning member 6 made of insulating material such as rubber fixed to the inner wall of the insulating tubular body 1. The other main surface of the heat buffer plate 5a is in a press-contact with the anode disk member 3a. The cathode electrode 4c of the semiconductor element 4 is in press-contact with the cathode disk member 3c with the heat buffer plate made of Mo or W interposed between them. Pressure to be applied on the semiconductor element 4 is produced in the electrode disk members 3a and 3c when the enclosure is assembled.

Thus, in the prior semiconductor device, the heat buffer plate 5a is brazed to the semiconductor element 4. In this case, the heat buffer plate 5a is made of Mo or W whose expansion coefficient is very approximate to that of silicon of the semiconductor element. Nevertheless, there is still an expansion coefficient difference between them. Because of this, the silicon substrate 4b and the heat buffer plate 5a operate together like a bimetal. Accordingly, when heated, the silicon substrate 4b and the heat buffer plate 5a are warped. To avoid the warp, a relatively thick plate must be used for the heat buffer plate 5a. Further, in the prior art device, a thermal strain is produced in the brazing process, reducing the breakdown voltage of the semiconductor device. The brazing process is also troublesome and time-consuming.

SUMMARY OF THE INVENTION

Accordingly, the object of the present invention is to provide a press-packed semiconductor device in which the heat buffer plate is not brazed to the semi-conductor element, and as a result no warp is developed even when a thin plate is used, and no reduction of the breakdown voltage is brought about by the thermal strain in a brazing process.

Another object of the present invention is to provide a press-packed semiconductor device in which, in assembling the semiconductor device, the semiconductor substrate can be positioned and press-packed easily and reliably.

Still another object of the present invention is to provide a press-packed semiconductor device in which the heat buffer plate is retained at a proper position of the electrode disk member without the fixing member which is used in the prior device.

These and other objects of the present invention can be accomplished by providing a press-packed semiconductor device comprising: a semiconductor element including a semiconductor substrate with first and second main surfaces; first and second electrodes formed on the first and second main surfaces of the semiconductor substrate respectively, the first electrode providing an exposed portion at the peripheral portion of the first main surface; first and second heat buffer plates contacting the first and second electrodes, respectively; first and second electrode disk members clamping therebetween the semiconductor element via the first and second heat buffer plates respectively in a pressing manner, the first electrode disk member fixing the first heat buffer plate; and a fixing member made of electrical insulating material and fixed on the exposed peripheral portion of the first main surface of the semiconductor substrate, the inner periphery surface of the fixing member being substantially in abutting contact with the outer periphery surface of the first heat buffer plate, thereby retaining the semiconductor element at a prescribed position.

DETAILED DESCRIPTION OF THE PREFERRED EMBODIMENTS

Figure 1:
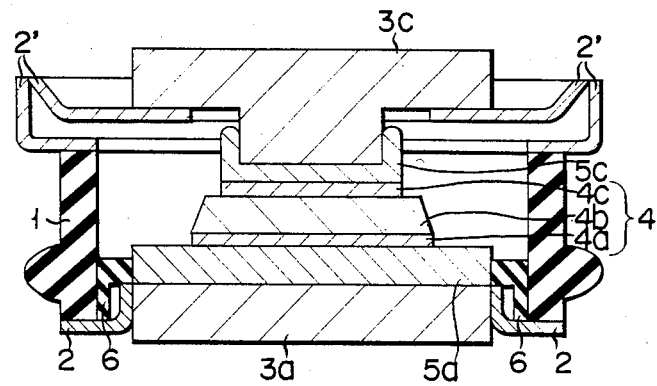
FIG. 1 is a longitudinal sectional view of a conventional press-packed semiconductor device.

Preferred embodiments of the present invention will be described referring to FIGS. 2 to 5. Throughout those figures, same symbols are used to same portions. A semiconductor device shown in FIG. 2, like the conventional semiconductor device, is provided with a tubular body 1 made of insulating material such as ceramic and a couple of ring-shaped covers 2 and 2' fixed to the end faces of the tubular body 1. The ring-shaped cover 2' comprises a member 2'a for supporting a cathode disk member 3c at the lower surface of a head 3d of the electrode disk member 3c, and a member 2'b fixed to the upper end surface of the tubular body 1 for supporting the member 2'a. The cathode disk member 3c is partially inserted into the assembly of the semiconductor device from an opening in the upper cover 2'. An anode disk member 3a is fitted into an opening in the lower cover 2. Both the disk members 3a and 3c press and support a semiconductor element 14 via the heat buffer plates 15a and 5c. The heat buffer plate 5c is a disk formed of molybdenum or tungsten foil. The heat buffer plate 5c is not necessarily fixed to the electrode disk member 3c. In the present embodiment, pawls 5d are formed at four points on the heat buffer plate 5c for fixedly coupling this plate with the disk member 3c.

Figure 2:
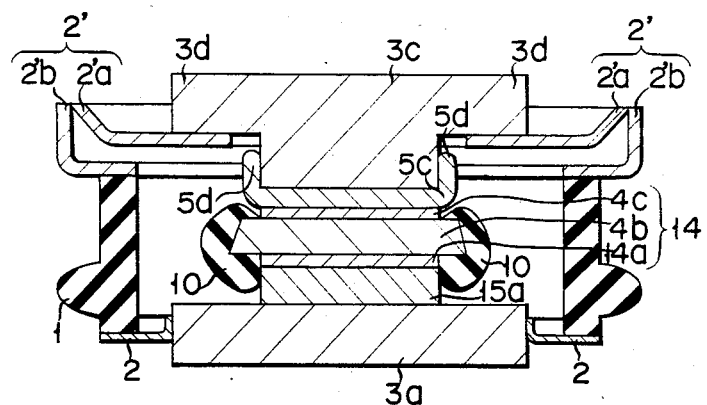
FIGS. 2 and 5 are longitudinal sectional views showing two different embodiments of a press-packed semiconductor device according to the present invention.
Figure 3:
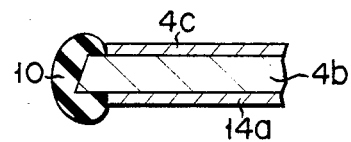
FIGS. 3 and 4 are longitudinal sectional view each showing the state of a retaining member fixed at the peripheral portion of a semiconductor substrate in one embodiment of the present invention.
Figure 4:
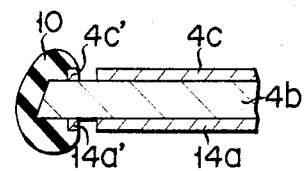

In the semiconductor device shown in FIG. 2, the heat buffer plate 15a is brazed to the anode disk member 3a. An anode electrode 14a made of Al or Au is provided in association with the semiconductor substrate 4b. A fixing member 10 made of electrical insulating material such as silicone resin is fixed to the exposed periphery of the semiconductor substrate 4b as shown in FIG. 3 or 4 which are to be described later in detail. The fixing member 10 is so formed that its inner periphery surface contacts the outer periphery surface of the heat buffer plate 15a. Accordingly, when the semiconductor element 14 is press-clamped, the inner periphery of the fixing member 10 is substantially in contact with the outer periphery of the heat buffer plate 15a. As a result the semiconductor element 14 is positioned in place with respect to the heat buffer plate 15a and retained laterally. It is preferable that the inner periphery of the fixing member 10 actually contacts the outer periphery of the heat buffer plate 15a. A slight gap between them is allowable, however, since no practical problem arises from the slight gap.

In order to provide the fixing member 10 at the peripheral portion of the semiconductor substrate 4b, fluid electrical insulating material, e.g. welded silicone resin, may be dropped on the exposed peripheral portion so as to flow to the side face of the substrate 4b as shown in FIG. 3. The flow of the insulating material is stopped by the electrodes 4c and 14a, and then the insulating material is solidified. A similar operation is applied for the other main surface. In this way, the fixing member 10 is formed. For making the inner periphery of the fixing member 10 physically contact the outer periphery of the heat buffer plate 15a, the electrode 14a should have substantially the same shape as that of the heat buffer plate 15a.

Alternatively, as shown in FIG. 4, ring projections 4c' and 14a' are provided slightly and outwardly separated from the electrodes 4c and 14a thereby to stop the flow of the insulating material. Since the ring projections 4c' and 14a' are provided for the flow stopping purpose only, they may be made of any material which can be formed on the semiconductor substrate, such as metal, silicon dioxide film and etc. If these projections as the flow stoppers are formed using the same material as that of the electrodes, however, the stoppers can be formed in the same step as that of the electrode formation, which offers a great convenience. The provision of the ring projections is preferable since these can completely prevent the electrodes from being covered with the insulating material. In the example of FIG. 4, the heat buffer plate 15a would be larger than the electrode 14a.

It is preferable, as shown in FIGS. 3 and 4, to cover the exposed portion including the side end face of the semiconductor substrate with the fixing member 10, since no discharge occurs when the semiconductor device is operated.

Figure 5:
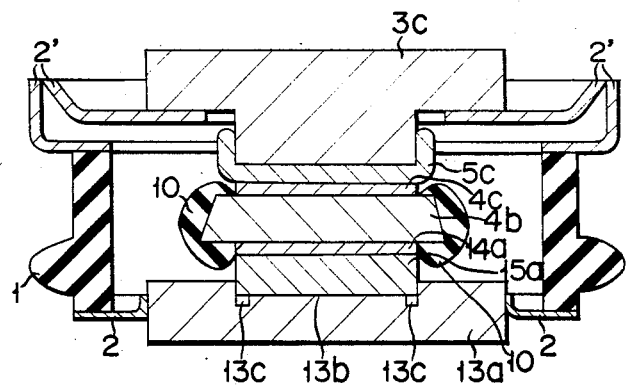

An embodiment of the invention shown in FIG. 5 is a modification of the embodiment shown in FIG. 2. In the FIG. 5 embodiment, a concave portion 13b is formed in the anode electrode disk member 13a into which the heat buffer plate 15a is just fitted. The heat buffer plate 15a is fitted in the concave portion 13b, so that it is positioned in place and fixed laterally. The fixing of the heat buffer plate 15a in the longitudinal direction is made by only the pressure. If so done, the step to braze the electrode disk member 13a to the heat buffer plate 15a may be omitted and the positioning of the heat buffer plate 15a is also easy.

When the concave portion 13b is formed, the peripheral portion of the bottom of the concave portion 13b tends to be curved in the course of its manufacturing. A small groove 13c defining the periphery of the future concave portion 13b, however, can remove such curving tendency in forming the concave portion, and therefore makes possible flatness over the entire bottom surface of the concave portion 13b.

In the above-mentioned embodiments, for positioning and fixing the semiconductor element, the heat buffer plate disposed on the anode side is fixed to the electrode disk member and the outer periphery of the heat buffer plate is made to substantially contact the inner periphery of the fixing member. However, this invention is not limited to the above embodiments. It is also possible that the heat buffer plate on the cathode electrode side be fixed to the cathode electrode disk member and its outer periphery be made to substantially contact the inner periphery of the fixing member, for the same purposes. Further, the inner periphery of the fixing member may be made to substantially contact the outer peripheries of the heat buffer plates of both the anode and cathode sides. In essence, at least one of the heat buffer plates is fixed to the corresponding electrode disk member, and the outer periphery of the fixed heat buffer plate (when both of the heat buffer plates are fixed, either of them is selected) is made to substantially contact the inner periphery of the fixing member, thereby positioning the semiconductor element with respect to the fixed heat buffer plate and retaining it in the lateral direction. The longitudinal fixing of the semiconductor element is of course made by the pressure applied on both sides thereof.

As described above, since the semiconductor element is not brazed to the heat buffer plate, no warp is developed unlike the bimetal, allowing the use of a thin heat buffer plate. Further, the positioning and the press-packing of the semiconductor element is very easy and reliable. Further, it is possible even to completely omit the troublesome brazing step in its manufacturing. The feature of no need of the positioning member, which is essential to the manufacture of the conventional semiconductor device, simplifies the construction of the semiconductor device and reduces the manufacturing cost.

What is claimed is:

1. A press-packed semiconductor device comprising:
   a semiconductor element including a semiconductor substrate with first and second main surfaces;
   first and second electrodes formed on said first and second main surfaces of said semiconductor substrate, respectively, said first electrode providing an exposed portion at the peripheral portion of said first main surface;

first and second heat buffer plates contacting said first and second electrodes, respectively said first heat buffer plate and said first electrode having substantially the same peripheral shape;

first and second electrode disk members clamping therebetween said semiconductor element via said first and second heat buffer plates respectively in a pressing manner, said first electrode disk member fixing said first heat buffer plate; and a fixing member made of electrical insulating material and fixed on said exposed peripheral portion of said first main surface of said semiconductor substrate, said member being in abutting relation with the periphery of said first electrode, the inner portion of the surface of said fixing member being substantially in contact with the other peripheral surface of said first heat buffer plate and the portion of said fixing member surface facing said first electrode disk member being rounded to facilitate the seating of said first heat buffer plate against said first electrode during assembly of said semiconductor device whereupon said first heat buffer plate and said first electrode are fixed in peripheral alignment.

2. The press-packed semiconductor device according to claim 1, wherein said fixing member is formed so as to extend over the side surface of said semiconductor substrate.

3. The press-packed semiconductor device according to claim 2, wherein said second electrode provides an exposed peripheral portion on said second main surface of said semiconductor substrate and said fixing member made of electrical insulating material is fixed on the exposed peripheral portions of said first and second main surfaces, as well as on said side surface of said semiconductor substrate.

4. The press-packed semiconductor device according to claim 1 wherein said first heat buffer plate is affixed by brazing to said first electrode disk member.

5. The press-packed semiconductor device according to claim 1, wherein a concave portion is formed in said first electrode disk member into which said first heat buffer plate is fitted, and said first heat buffer plate is positioned in place and fixed in the lateral direction by fitting said first heat buffer plate into said concave portion, and the fixing of said first heat buffer plate along the center axis of the device is made by only pressure.

6. The press-packed semiconductor device according to claim 1, wherein said fixing member is made of silicone resin.

7. A press-packed semiconductor device comprising:
a semiconductor element including a semiconductor substrate with first and second main surfaces;

first and second electrodes formed on said first and second main surfaces of said semiconductor substrate, respectively, said first electrode providing an exposed portion at the peripheral portion of said first main surface;

first and second heat buffer plates contacting said first and second electrodes, respectively;

first and second electrode disk members clamping therebetween said semiconductor element via said first and second heat buffer plates respectively in a pressing manner, said first electrode disk member fixing said first heat buffer plate;

ring means mounted on said exposed peripheral portion of said first main surface, said ring means being slightly separated from said first electrode; and a fixing member made of electrical insulating material and fixed on said ring means and on said exposed peripheral portion of said first main surface of said semiconductor substrate, the inner portion of the surface of said fixing member being substantially in contact with the outer peripheral surface of said first heat buffer plate and the portion of said fixing member surface facing said first electrode disk member being rounded to facilitate the seating of said first heat buffer plate against said first electrode during assembly of said semiconductor device.

8. A press-packed semiconductor device comprising:
a semiconductor element including a semiconductor substrate with first and second main surfaces;

first and second electrodes formed on said first and second main surfaces of said semiconductor substrate respectively, said first electrode providing an exposed portion at the peripheral portion of said first main surface;

first and second heat buffer plates contacting said first and second electrodes, respectively;

first and second electrode disk members clamping therebetween said semiconductor element via said first and second heat buffer plates respectively in a pressing manner; said first electrode disk member fixing said first heat buffer plate;

a fixing member made of electrical inslulating material and fixed on said exposed peripheral portion of said first main surface of said semiconductor substrate, the inner periphery surface of the fixing member being substantially in abutting contact with the outer periphery surface of said first heat buffer plate, thereby retaining said semiconductor element at a prescribed position, and wherein a ring-like projection is provided on said exposed peripheral portion of said semiconductor substrate, being slightly separated from said first electrode, and said fixing member extends up to said ring-like projection.

* * * * *